(12) United States Patent
Peng et al.

(10) Patent No.: US 8,625,285 B2
(45) Date of Patent: *Jan. 7, 2014

(54) DATA CENTER WITH CABLE MANAGEMENT STRUCTURE

(75) Inventors: Wen-Tang Peng, New Taipei (TW); Yi-Liang Hsiao, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 264 days.

This patent is subject to a terminal disclaimer.

(21) Appl. No.: 13/221,885

(22) Filed: Aug. 30, 2011

(65) Prior Publication Data

US 2013/0021756 A1    Jan. 24, 2013

(30) Foreign Application Priority Data

Jul. 21, 2011   (TW) .............................. 10125869 A

(51) Int. Cl.
*H05K 5/00* (2006.01)
(52) U.S. Cl.
USPC .......................................... 361/724
(58) Field of Classification Search
USPC ................................. 361/724–727
See application file for complete search history.

(56) References Cited

U.S. PATENT DOCUMENTS

| | | | |
|---|---|---|---|
| 5,726,866 A * | 3/1998 | Allen ............................ 361/816 |
| 6,406,327 B1 * | 6/2002 | Soon ............................. 439/501 |
| 6,909,611 B2 * | 6/2005 | Smith et al. ................... 361/727 |
| 7,095,616 B2 * | 8/2006 | Soeda et al. .................. 361/724 |
| 7,113,991 B1 * | 9/2006 | Miyamoto et al. ............. 709/226 |
| 7,181,543 B2 * | 2/2007 | King et al. ..................... 709/250 |
| 7,280,366 B1 * | 10/2007 | Hendrix et al. ............... 361/724 |
| 7,355,859 B2 * | 4/2008 | Peterson et al. .............. 361/724 |
| 7,359,186 B2 * | 4/2008 | Honda et al. ............. 361/679.33 |
| 7,460,375 B2 * | 12/2008 | Randall et al. ................ 361/724 |
| 8,254,148 B2 * | 8/2012 | Hsiao et al. ................... 361/826 |
| 8,387,933 B2 * | 3/2013 | Yu et al. .................... 248/220.22 |
| 8,472,198 B2 * | 6/2013 | Peng et al. ..................... 361/724 |
| 2003/0223193 A1 * | 12/2003 | Smith et al. .................... 361/687 |
| 2008/0123301 A1 * | 5/2008 | Vogel et al. .................... 361/724 |
| 2009/0086441 A1 * | 4/2009 | Randall et al. ................ 361/724 |
| 2009/0161322 A1 * | 6/2009 | Hughes .......................... 361/724 |
| 2009/0261214 A1 * | 10/2009 | Beauchamp et al. ........ 248/74.1 |
| 2009/0305538 A1 * | 12/2009 | Caveney et al. ............... 439/207 |
| 2010/0008051 A1 * | 1/2010 | Fan et al. ....................... 361/724 |
| 2010/0110628 A1 * | 5/2010 | Barrenechea et al. ... 361/679.48 |
| 2011/0180297 A1 * | 7/2011 | Yu et al. ........................... 174/69 |
| 2012/0155034 A1 * | 6/2012 | Hsiao ............................. 361/726 |
| 2012/0312934 A1 * | 12/2012 | Dai et al. .......................... 248/70 |

* cited by examiner

*Primary Examiner* — Lisa Lea Edmonds
(74) *Attorney, Agent, or Firm* — Altis Law Group, Inc.

(57) ABSTRACT

A data center includes a housing and a number of server units arranged in the housing. Each server unit includes a server module and a cable management member. The first ends of a number of cables are connected to the back panel of the server module. The cable management member includes a bottom plate, a front plate, and two side plates. A number of connectors are set on the front plate. The second ends of the cables are connected to the connectors. The cable management member is fixed to one side of the server module. The cables are received in a space formed between the bottom plate of the cable management member and the server module.

3 Claims, 4 Drawing Sheets

DATA CENTER WITH CABLE MANAGEMENT STRUCTURE

BACKGROUND

1. Technical Field

The disclosure generally relates to data centers; and more particularly to a data center having a cable management structure.

A data center usually includes a plurality of connectors set on the front side of the data center. However, electronic devices, such as servers, arranged in the data center often include cables extending from backs of the electronic devices creating messy wire runs when connected to the connectors.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
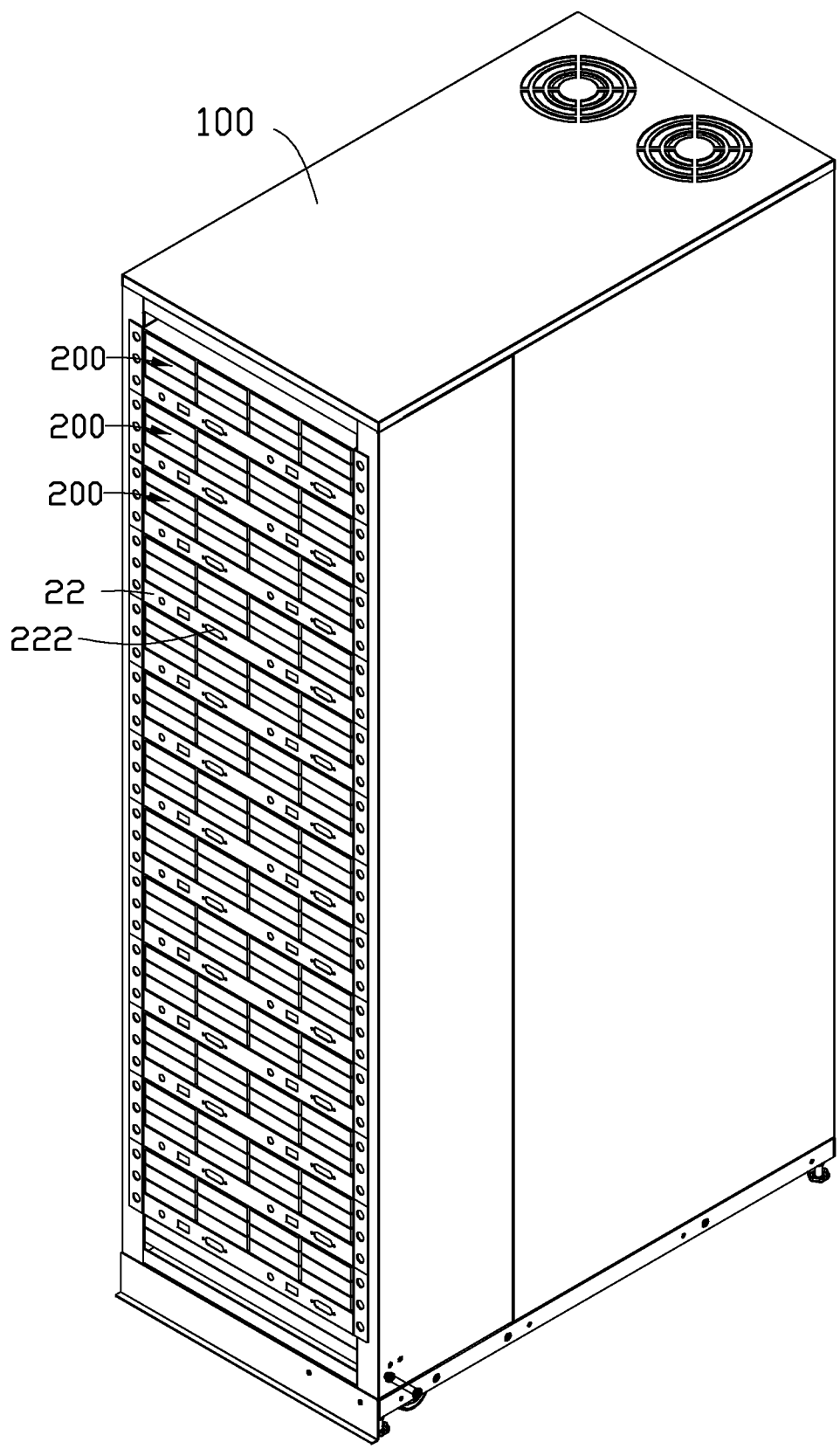
FIG. 1 is an assembled view of a data center, which includes a plurality of server units, in accordance with an embodiment.

Referring to FIG. 1, an exemplary embodiment of a data center includes a housing 100 and a plurality of server units 200 received in the housing 100.

Figure 2:
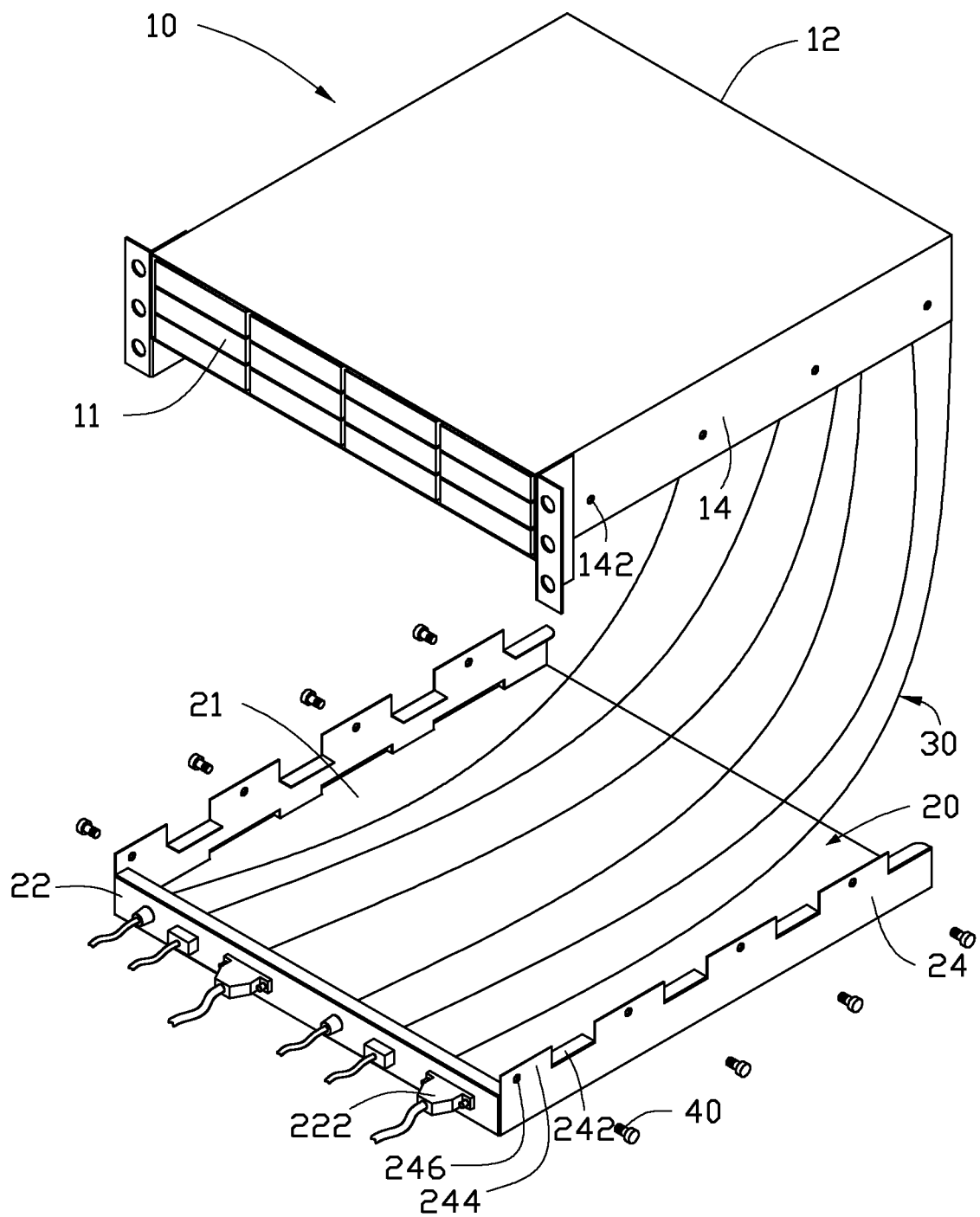
FIG. 2 is an exploded, isometric view of one of the server units of FIG. 1.
Figure 3:
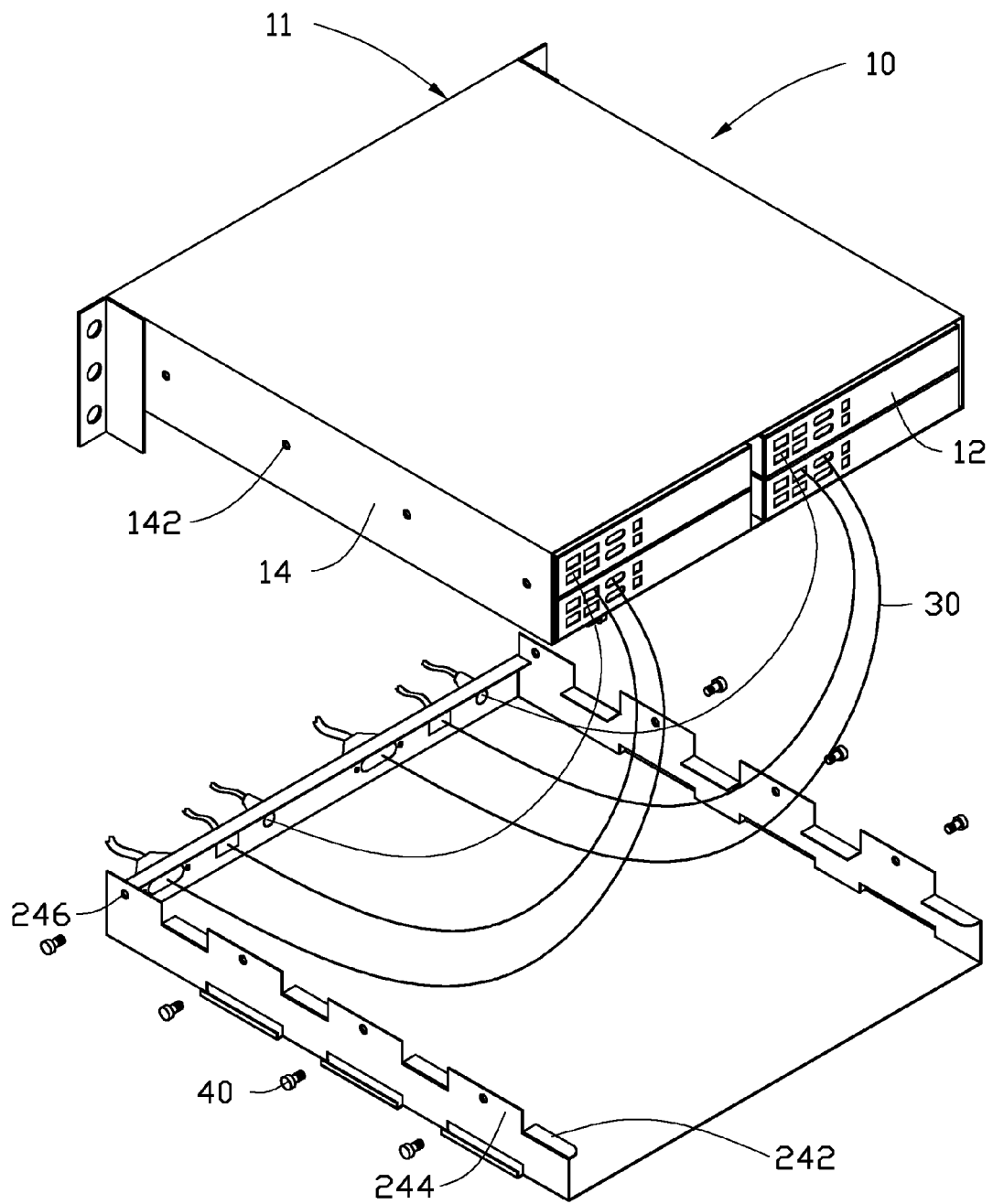
FIG. 3 is similar to FIG. 2, but viewed from a different aspect.

Referring to FIG. 2 and FIG. 3, each server unit 200 includes a server module 10 and a cable management member 20. The server module 10 includes a front panel 11, a back panel 12 electrically connected to electronic components of the server modules 10, and two opposite sidewalls 14 connected between the front panel 11 and the back panel 12. First ends of a plurality of cables 30 are electrically connected to the back panel 12. A plurality of mounting holes 142 is defined in the sidewalls 14.

The cable management member 20 includes a bottom plate 21, a front plate 22 extending from a front end of the bottom plate 21, and two side plates 24 extending from opposite sides of the bottom plate 21. A plurality of connectors 222 is set on the front plate 22. A plurality of supporting pieces 242 perpendicularly extend inward from a top of each side plate 24. A plurality of blocking pieces 244 extend up from the top of each side plate 24. Each blocking piece 244 defines a through hole 246.

Figure 4:
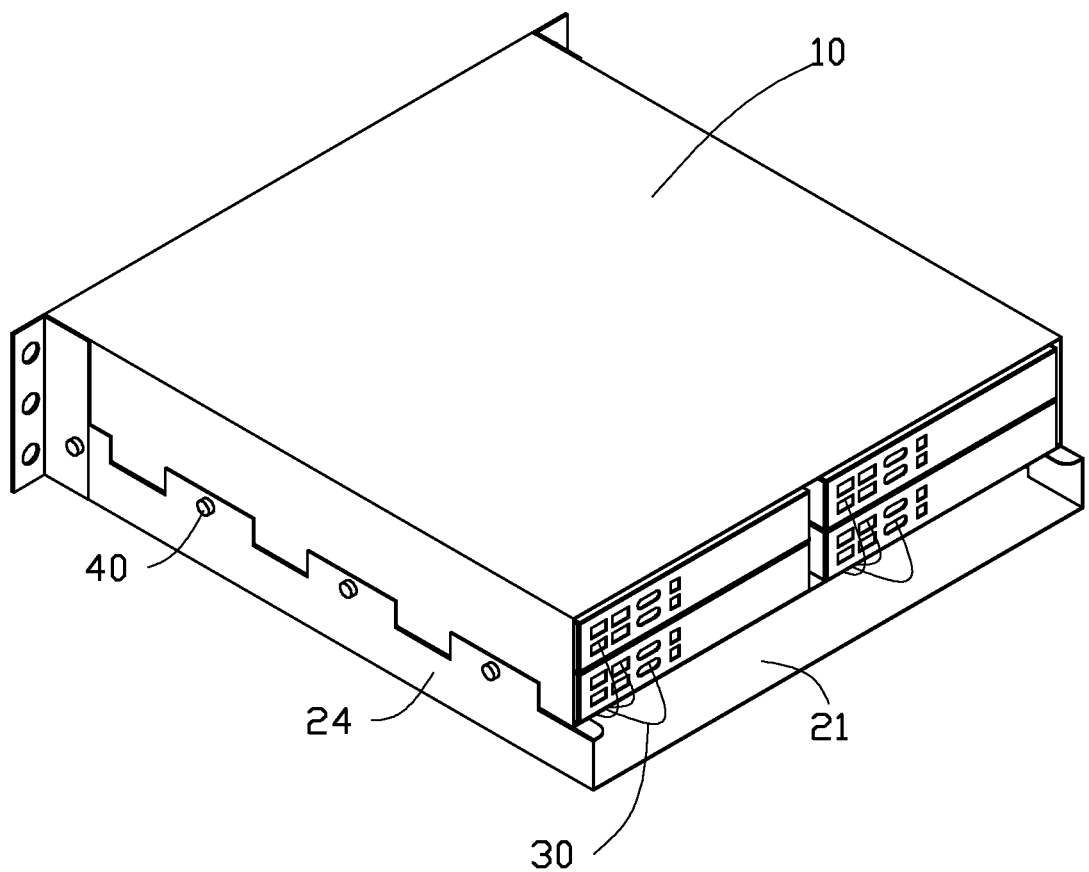
FIG. 4 is an assembled view of FIG. 3.

Referring to FIG. 4, in assembly, second ends of the cables 30 are connected to the connectors 222. The server module 10 is supported on the supporting pieces 242 of the cable management member 20. The blocking pieces 244 block the corresponding sidewalls 14. A plurality of screws 40 extends through the through holes 246 to screw into the mounting holes 142 of the server module 10. The front plate 22 is coplanar with the front panel 11. The side plates 24 are coplanar with the sidewalls 14 respectively. The cables 30 are received in a space formed between the bottom plate 21 and the server module 10.

Obviously, the cable management member 20 can be fixed either to a top of the server module 10 or one sidewall 14 of the server module 10.

Referring to FIG. 1, the assembled server unit 200 is then received in the housing 100. In this data center, the cables 30 extend through the cable management member 20 to connect the back panel 12 to the connectors 222 of the front plate 22, which maintains the cables 30 in an orderly manner.

Even though numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the present disclosure to the full extent indicated by the broad general meaning of the terms in which the appended claims are expressed.

What is claimed is:

1. A data center comprising:
a housing; and
a plurality of server units received in the housing, wherein each of the server units comprises a server module and a cable management member fixed to one side of the server module; the server module comprises a front panel, a back panel, and two opposite sidewalls connected between the front panel and the back panel; the cable management member comprises a bottom plate, a front plate extending from a front end of the bottom plate, and two side plates extending from opposite sides of the bottom plate, a plurality of connectors is set on the front plate, first ends of a plurality of cables are electrically connected to the back panel, second ends of the cables are connected to the connectors, the front plate is coplanar with the front panel, the side plates are coplanar with the sidewalls respectively, the cables are received in a space formed between the bottom plate of the cable management member and the server module.

2. The data center of claim 1, wherein a plurality of supporting pieces extend inward from each of the side plates, the server module is supported on the supporting pieces.

3. The data center of claim 2, wherein a plurality of mounting holes are defined in the sidewalls of the server module, a plurality of blocking pieces extend up from each side plate, each of the blocking pieces defines a through hole, a plurality of screws extend through the through holes of the blocking pieces to screw into the mounting holes of the server module.

* * * * *